United States Patent [19]

Florjancic et al.

[11] Patent Number: 4,909,909

[45] Date of Patent: Mar. 20, 1990

[54] METHOD FOR FABRICATING A FULLY SHIELDED SIGNAL LINE

[75] Inventors: Matjaz Florjancic, Murr; Horst Richter, Boblingen; Stauros Smernos, Stuttgart; Hans Reiner, Gerlingen, all of Fed. Rep. of Germany

[73] Assignee: Alcatel N.V., Netherlands

[21] Appl. No.: 338,269

[22] Filed: Apr. 14, 1989

[30] Foreign Application Priority Data

Apr. 14, 1988 [DE] Fed. Rep. of Germany ....... 3812414

[51] Int. Cl.4 ................................................ C25D 5/02
[52] U.S. Cl. ...................................... 204/15; 204/38.1
[58] Field of Search ................................. 204/15, 38.1

[56] References Cited

U.S. PATENT DOCUMENTS 4,673,904 6/1987 Landis ................................ 333/238
4,751,105 6/1988 Kisters .................................. 427/98

FOREIGN PATENT DOCUMENTS 3006117 8/1981 Fed. Rep. of Germany .

OTHER PUBLICATIONS

R. Landis, "High—Speed Packaging for GaAs Interconnection", *Proceedings Electronic Components Conference*, Washington, 1985, pp. 384–388.

*Primary Examiner*—T. M. Tufariello
*Attorney, Agent, or Firm*—Christie, Parker & Hale

[57] ABSTRACT

Coaxial signal lines of rectangular cross-section are fabricated for use in integrated high- and ultra-high-frequency circuits, thereby eliminating crosstalk. A photolithographic film not only assists in the formations of metallic conductive areas, but also remains between those conductive areas as the dielectric material between inner and outer conductors of a fully shielded rectangular coaxial cable. The coaxial cable is formed in a process which comprises various photoprocessing, electrodeposition, chemical deposition and chemical etching steps, but which avoids mechanical surfacing to remove insulating material from adjacent portions of the conductive walls of the outer conductor of the coaxial cable.

5 Claims, 1 Drawing Sheet

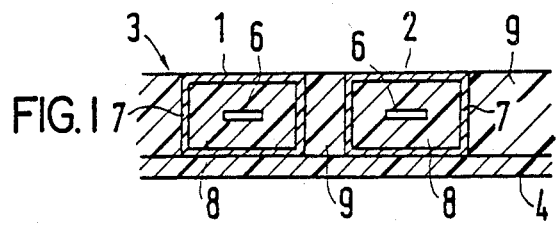
FIG. 1
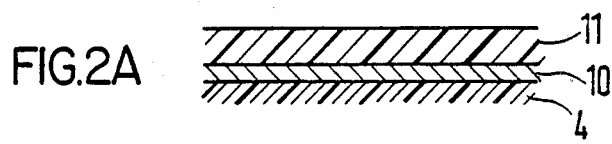
FIG. 2A
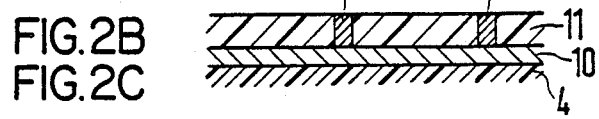
FIG. 2B
FIG. 2C
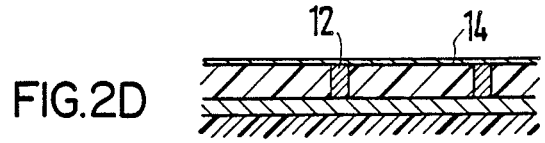
FIG. 2D
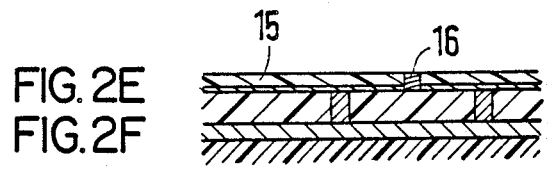
FIG. 2E
FIG. 2F
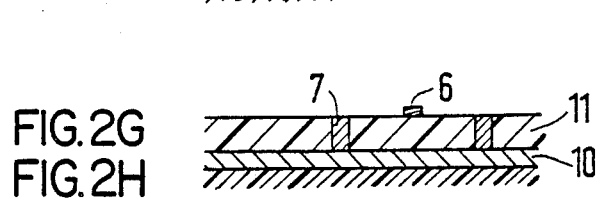
FIG. 2G
FIG. 2H
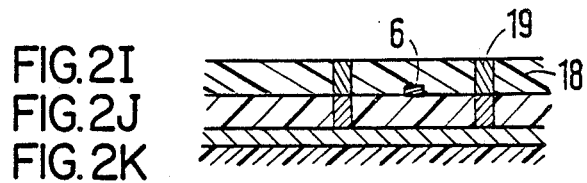
FIG. 2I
FIG. 2J
FIG. 2K
FIG. 2L
FIG. 2M

METHOD FOR FABRICATING A FULLY SHIELDED SIGNAL LINE

TECHNICAL FIELD

The invention concerns a process for fabrication of a fully shielded signal line for high-frequency circuits.

BACKGROUND ART

Prior art fully shielded signal lines for high-frequency circuits include coaxial cables with a rectangular cross-section and fully shielded "triplate" cables such as are used to connect high- and ultra-high-frequency circuits, specially in integrated microwave circuits.

A prior art process for fabrication of fully shielded signal lines in semiconductor-high-frequency circuits is disclosed in Proceedings of Electronic Components Conference, Washington, 1985, pp. 384–388, 386. That process includes, along with other process steps, (a) the application of a photolithographic film onto a conductive substrate, (b) forming gaps in the photosensitive film corresponding to portions of the outer conductive walls of a rectangular coaxial cable, and (c) electrodepositing copper in those gaps to form corresponding portions of the walls. In that process, after step (c), heat and pressure is used to laminate an insulating prepreg film onto both the exposed portions of the substrate and onto the conductive tracks; the insulating material covering the conductive tracks is then selectively mechanically removed in a subsequent surfacing step, whereupon a similar layer of copper tracks separated by an insulating material may be formed on the first layer, with at least some of the some conductive tracks of the first layer in electrical contact with corresponding conductive tracks in the second layer. The required mechanical removal of the prepreg material is however difficult to perform and is expensive.

DISCLOSURE OF INVENTION

The objective of the invention is thus to provide a simple and inexpensive process for fabrication of fully shielded signal lines in high- and ultra-high-frequency circuits, whereby crosstalk between signal lines may be reduced or eliminated in a reliable manner.

BRIEF DESCRIPTION OF DRAWINGS

An exemplary embodiment of the invention is explained in the following detailed description of a presently preferred embodiment, reference being made to figures of the accompanying Drawing wherein:

FIG. 1 shows coaxial cables having a rectangular cross-section such as may be fabricated by means of the invention; and FIG. 2 represents schematically the process steps used in a preferred embodiment of the invention.

BEST MODE FOR PRACTICING THE INVENTION

Two signal lines 1 and 2 fabricated according to the invention are components of an ultra-high-frequency circuit 3 fabricated with semiconductor technology are shown in cutaway in the Drawing (FIG. 1). The signal lines 1 and 2 are formed as rectangular coaxial lines which are arranged on one common base 4.

The base 4 is, for example, fabricated from a fiber-glass reinforced epoxy resin. The signal lines 1 and 2 each have an inner conductor 6 and an outer conductor or an external shield 7. The inner conductor 6 and the outer conductor 7 are fabricated from a suitable conductive material, for example, copper.

The inner cavity of the signal lines 1, 2 and the space 9 between the signal lines 1 and 2 and other circuit components are filled with a dielectric material, for example, epoxy or polyimide, These areas filled with dielectric, as will be explained with reference to FIG. 2, are fabricated from a photosensitive material, preferably a permanent resist film, for example, a conventional de-hardened solder resist film, using various photo-forming techniques that are conventionally used for fabricating printed circuit boards and the like.

The individual steps of the process according to the invention are schematically presented in FIG. 2, progressing from top to bottom. They are referenced in the Drawing with the letters (a) through (m), which correspond to the sequential process steps (a) through (m) of a preferred embodiment of the invention. These letters thus refer to the consecutive process steps used to produce the depicted structure and may refer only indirectly to the individual layers of materials.

Process step (a):

A photosensitive film 11 is laminated onto a support material 10 coated or metallized with copper. The base 4 consists, for example, of the fiberglass reinforced plastic known as FR4; the photosensitive film 11 is formed of a permanent resist, for example, of a readily available solder barrier film adapted for subsequent de-hardening ("Lötstoppresist mit Endhärtung").

Process step (b):

The photolithographic film 11 is subjected to a conventional photoprocess which consists of exposure to light of the areas which are to remain and a subsequent developmental procedure. In this process, the portions of the film which correspond to the location of the outer conductor 7 of the finished signal line 1 or 2, are removed to thereby form a lower set of gaps 12.

Process step (c):

The lower gaps 12 in the with the film removed are filled with copper by electrodeposition.

Process step (d):

A thin conductive layer 44 is applied by chemical deposition of copper onto the exposed surfaces (the upper surface in the Drawing) of the remaining areas of the film 11 and the outer conductor areas 12 filled with copper. This conductive layer 14 is linked as an electrical conductor over the areas 12 with the copper layer 10.

Process step (e):

A photoresist film 15 is applied onto the conductive layer 14, and signal line regions 16 are removed from it through another photoprocess. These regions 16 correspond to the location of the inner conductor 6 of the signal line 1 or 2.

Process step (f)

The regions 16 are brought to the required thickness for a signal line through electrodeposition of copper.

Process step (g):

The remaining areas of the photoresist film 15 are stripped away, i.e. chemically dissolved.

Process step (h):

The conductive layer 14 exposed by the stripping away of the photoresist film 15 is removed by copper differential etching. Thus, the lower half of the outer conductor 7 is fabricated and the inner conductor 6 is galvanically isolated from the other conductive areas, i.e., from the outer conductor 7.

Process step (i):

A second photolithographic film 18 is laminated onto the exposed surface. This film 18 also consists of a permanent resist, for example, the same readily available solder barrier film that was used as the first photolithographic film 11.

Process step (j):

The film 18 is removed by an additional photoprocess in upper gap areas 19, which correspond to the upper part of the outer conductor 7.

Process step (k):

The upper gaps 19 in the film 18 are filled with copper by electrodeposition.

Process step (l):

A thin conductive layer 20 is applied by chemical deposition to the free surface of the remaining film 18 and the areas 19 filled with copper.

Process step (m):

Finally, copper is electrodeposited onto this conductive layer 20 until the required wall thickness of the upper wall of outer conductor 7 is obtained.

Thus, the process is completed. It is possible to fabricate one or several fully shielded signal lines for high-frequency circuits simultaneously in a single fabrication process, without any intermediate mechanical surfacing or other similar mechanical processing steps.

While a preferred embodiment of this invention is shown above, it will be understood, of course, that the invention is not to limited thereto. It is contemplated, therefore, by the appended claims to cover any such modification as fall within the true spirit and scope of this invention

What is claimed is:

1. Method for fabricating a fully shielded signal line for high-frequency circuits having an inner conductor surrounded by an outer conductor formed from conductive walls connecting conductive top and bottom layers, comprising the steps:

(a) laminating a first photosensitive film onto a conductive base layer which includes the bottom layer of the outer conductor,
   (b) thereafter employing a photoprocess to remove a first portion of the thus-laminated first photosensitive film to thereby define at least two lower gaps in said first photosensitive film each extending down to said metallized base layer and corresponding to a lower portion of one said walls, said lower gaps being separated by a lower dielectric layer formed from a second portion of said first photosensitive film which remains laminated onto said metalized base layer,
   (c) thereafter filling each of the thus-defined lower gaps with a conductive material by electrodepositing said conductive material onto respective portions of the metalized base at the bottom of each of the lower gaps to thereby form said lower wall portions,
   (d) thereafter chemically depositing a thin conductive layer over the entirety of a first exposed surface comprising an upper surface of said dielectric material and upper surfaces of the conductive material forming said lower wall portions,
   (e) thereafter applying a photoresist film onto the thin conductive layer and subsequently employing a photoprocess to remove a predetermined area of the thus-applied photoresist film to thereby form an exposed region of the thin conductive layer corresponding to a bottom surface of the inner conductor
   (f) thereafter electrodepositing a conductive material onto in the thus-exposed region to thereby form the inner conductor,
   (g) thereafter stripping away any remaining photoresist film thereby exposing a portion of the thin conductive layer extending from the inner conductor,
   (h) thereafter removing the thus-exposed portion of the thin conductive layer by differential etching to thereby electrically isolate the inner conductor from the conductive material forming the lower wall portions and from the metalized base layer,
   (i) thereafter laminating a second photosensitive film onto the entirety of a second exposed surface comprising the upper surface of said dielectric material and upper surfaces of the conductive material forming said lower wall portions and said inner conductor,
   (j) thereafter removing by means of a photoprocess a first portion of the thus-laminated second photosensitive film to thereby define at least two upper gaps in said second photosensitive film, each extending down to the upper surface of the lower portion of one said walls and corresponding to a respective upper portion of said walls, said upper gaps being separated by a second dielectric layer formed from a second portion of said second photosensitive film which remains laminated onto said second exposed surface
   (k) thereafter filling each of the thus-defined upper gaps with a conductive material by electrodepositing said conductive material onto the upper surface of the respective lower wall portion at the bottom of each of the upper gaps to thereby form said upper wall portions,
   (l) thereafter chemically depositing a second thin conductive layer over a third exposed surface comprising an upper surface of said upper dielectric material and upper surfaces of the conductive material forming said upper wall portions, and
   (m) thereafter electrodepositing conductive material on at least portions of the second thin conductive layer corresponding to the upper layer of the outer conductor until a predetermined thickness of conductive material is obtained.

2. The process according to claim 1, wherein a permanent resist film is used for said lower and upper dielectric materials.

3. The process according to claim 1, wherein a dehardened solderstop resist film is used as the photosensitive film.

4. The process according to claim 1 wherein said conductive base layer is supported on a substrate of fiberglass reinforced epoxy plastic.

5. The process according to claim 1, where said first and second thin conductive films and said conductive material consist essentially of copper or a metallic compound containing copper.

* * * * *

UNITED STATES PATENT AND TRADEMARK OFFICE
CERTIFICATE OF CORRECTION

PATENT NO.   :   4,909,909
DATED        :   March 20, 1990
INVENTOR(S)  :   M. Florjancic; H. Richter; S. Smernos; H. Reiner It is certified that error appears in the above-identified patent and that said Letters Patent is hereby corrected as shown below:

```
Column 1, line 33, before "conductive" delete "some".

Column 2, line 3, after "cavity" insert -- 8 --.
Column 2, line 6, after "polyimide" delete the comma and
         insert a period.
Column 2, line 40, after "12" delete "in the".
Column 2, line 43, change "44" to -- 14 --.

Column 3, line 29, before "limited" insert -- be --.
```

In the Claims

```
Column 4, line 7, after "onto" delete "in".
Column 4, line 29, delete "one".
Column 4, line 34, after "surface" insert a comma.
Column 4, line 60, change "where" to -- wherein --.
```

Signed and Sealed this

Tenth Day of September, 1991

Attest:

HARRY F. MANBECK, JR.

*Attesting Officer*    *Commissioner of Patents and Trademarks*